(12) United States Patent
Wu

(10) Patent No.: US 10,388,811 B2
(45) Date of Patent: Aug. 20, 2019

(54) PROCESS FOR PREPARING A PHOTOVOLTAIC CELL

(71) Applicant: Yutao Wu, Hangzhou (CN)

(72) Inventor: Yutao Wu, Hangzhou (CN)

(73) Assignee: Yutao Wu, HangZhou (CN)

( * ) Notice: Subject to any disclaimer, the term of this patent is extended or adjusted under 35 U.S.C. 154(b) by 4 days.

(21) Appl. No.: 15/523,296

(22) PCT Filed: Oct. 26, 2015

(86) PCT No.: PCT/CN2015/000714
§ 371 (c)(1),
(2) Date: Apr. 28, 2017

(87) PCT Pub. No.: WO2016/065735
PCT Pub. Date: May 6, 2016

(65) Prior Publication Data
US 2017/0330985 A1    Nov. 16, 2017

(30) Foreign Application Priority Data
Oct. 28, 2014  (CN) .......................... 2014 1 0587635

(51) Int. Cl.
*H01L 31/048* (2014.01)
*B32B 17/10* (2006.01)
(Continued)

(52) U.S. Cl.
CPC .... *H01L 31/0481* (2013.01); *B32B 17/10706* (2013.01); *B32B 17/10761* (2013.01);
(Continued)

(58) Field of Classification Search
CPC .................................................. H01L 31/0481
See application file for complete search history.

(56) References Cited

U.S. PATENT DOCUMENTS 6,323,415 B1 *  11/2001  Uematsu .......... B32B 17/10018
136/246

FOREIGN PATENT DOCUMENTS

CN    101710602 A    5/2010
CN    102136515 A    7/2011
(Continued)

OTHER PUBLICATIONS

The World Intellectual Property Organization (WIPO) International Search Report for PCT/CN2015/000714 dated Jan. 28, 2016.

*Primary Examiner* — Mohammad M Choudhry
(74) *Attorney, Agent, or Firm* — Anova Law Group, PLLC

(57) ABSTRACT

A process for encapsulating a photovoltaic cell, comprising the steps of: (1) sequentially laying back-panel, ethylene-vinyl acetate copolymer (hereinafter referred to as EVA), cell group, EVA and glass from bottom to top; subsequently, laminating the module after all layers are aligned; (2) mounting accessories to the laminated module; the cell group comprises a plurality of cell pieces, which is electrically connected through electric conductors; a light-absorbing strip is disposed between the cell pieces, which is used to refract or reflect the light irradiating on the space between the cell pieces to other areas on the cell pieces; after aligning the light-absorbing strip to the spaces between the cell pieces, the laminating process of the module can be performed.

12 Claims, 4 Drawing Sheets

(51) Int. Cl.
*B32B 27/30* (2006.01)
*H01L 31/05* (2014.01)

(52) U.S. Cl.
CPC .......... *B32B 27/306* (2013.01); *H01L 31/048* (2013.01); *H01L 31/0508* (2013.01); *B32B 2457/12* (2013.01); *Y02E 10/50* (2013.01)

(56) References Cited

FOREIGN PATENT DOCUMENTS

| | | |
|---|---|---|
| CN | 202004028 U | 10/2011 |
| CN | 102522460 A | 6/2012 |
| CN | 103400881 A | 11/2013 |
| CN | 104319314 A | 1/2015 |
| WO | WO 2012/122944 A1 * | 9/2012 |

\* cited by examiner

PROCESS FOR PREPARING A PHOTOVOLTAIC CELL

CROSS-REFERENCES TO RELATED APPLICATIONS

This application is a national phase entry under 35 U.S.C. § 371 of International Application No. PCT/CN2015/000714, filed on Oct. 26, 2015, which claims the priority to, and benefits of Chinese Patent Application Serial No. 201410587635.6, filed with the State Intellectual Property Office of P. R. China on Oct. 28, 2014, the entire contents of both of which are incorporated herein by reference.

TECHNICAL FIELD OF THE INVENTION

The present invention relates to the technical field of solar cells, and more particularly, to a process for preparing a photovoltaic cell.

BACKGROUND OF THE INVENTION

A traditional crystalline silicon photovoltaic cell has metal electrode on both the front and rear surfaces. These upper and lower metal electrodes are crucial for collecting and transmitting photo-generated carriers, forming a part of the main structure of a photovoltaic cell. Meanwhile, the metal electrode located on the front surface can affect the conversion efficiency of a photovoltaic cell in some degree due to a part of the light being blocked by the electrodes, resulting in a power loss at about 5%-9%. In order to reduce the blocking light loss of the front surface of a photovoltaic cell, those skilled in the art have proposed various technical solutions. For instance, Chinese patent application publication no. CN103824893A discloses a solar cell having a light refractor, which is a structure capable of reducing the blocking light loss of the solar cell. Furthermore, Chinese patent application publication no. CN203812889U named "solar cell having a light reflector" also discloses a solar cell structure capable of lowering the blocking light loss. However, the encapsulating process of these two structures are not explicitly provided in the prior art.

SUMMARY OF THE INVENTION

The purpose of the present invention is to solve the shortcomings in the prior art, and provide a process for preparing a photovoltaic cell to traditional solar cell structures having a reflector or a refractor.

To achieve the above purpose, the present invention adopts the following technical solution:

A process for encapsulating a photovoltaic cell, comprising the steps of:

(1) Sequentially laying back-panel, ethylene-vinyl acetate copolymer (hereinafter referred to as EVA), cell group, EVA and glass from bottom to top; subsequently, laminating the module after all layers are aligned;

(2) Mounting accessories to the laminated module;

The cell group comprises a plurality of cell pieces, which is electrically connected through electric conductors. Meanwhile, a light-absorbing strip, which is disposed between the cell pieces, is used to refract or reflect the light irradiating on the space between the cell pieces to other areas on the cell piece. After aligning the light-absorbing strip to the spaces between the cell pieces, the laminating process of the module can be performed.

In another aspect of the present invention, during the process for encapsulating a photovoltaic cell, the light-absorbing strip is a groove-shaped structure, which is disposed on the glass and has an inverted triangle-shaped cross section. Each of the two base angles of the inverted triangle is not less than 45 degrees, and the inner wall of each base angle is transparent. The light-absorbing strip is disposed to correspond to the space between the cell pieces.

In another aspect of the present invention, during the process for encapsulating a photovoltaic cell, the light-absorbing strip is a prism structure, which is disposed in the space between the cell pieces and has a triangle-shaped cross section. The prism structure is correspondingly bonded to the space between the cell pieces.

In another aspect of the present invention, during the process for encapsulating a photovoltaic cell, the method for electrically connecting the cell pieces through the electric conductors, comprising the steps of:

Firstly, bonding the fingers of the front-side electrode that are perpendicular to the cell piece to the electric conductor through conductive adhesive, wherein the length of the electric conductor is two times of that of a cell piece; subsequently, when the cell pieces are electrically connected, bonding the portion of the electric conductor that exceeds the length of a cell piece to the rear-side electrode of another cell piece through the conductive adhesive, thereby electrically connecting the positive electrode of one cell piece to the negative electrode of another.

In another aspect of the present invention, during the process for encapsulating a photovoltaic cell, the electric conductor comprises a conductive band and a light-reflecting prism structure having a triangle-shaped cross section. Each of the two base angles of the triangle is not less than 45 degrees, and the surface of each base angle is mirror-surface processed. The bottom edge of the light-reflecting prism structure is bonded to the conductive band, and the length of the bottom edge is as long as the width of the conductive band. When electrically connecting the cell pieces, the connecting process comprises the steps of:

(1) Bonding the light-reflecting prism structure having a triangle-shaped cross section to the conductive band; at this moment, the length of the triangle-shaped light-reflecting prism structure is as long as that of a cell piece; subsequently, perpendicularly bonding or soldering the conductive band that is bonded to the light-reflecting prism structure to the fingers through conductive adhesive; finally, electrically connecting the portion of the conductive band which exceeds the length of a cell piece to the rear-side electrode of another cell piece through soldering or conductive adhesive; repeating the above steps, thereby implementing the electrical connection of the cell pieces.

(2) Perpendicularly bonding the conductive band to the fingers through the conductive adhesive; subsequently, electrically connecting the portion of the conductive band that exceeds the length of a cell piece to the rear-side electrode of another cell piece through soldering or conductive adhesive; finally, bonding the triangle-shaped light-reflecting prism structure to the conductive band of the cell piece; repeating the above steps, thereby implementing the electrical connection of the cell pieces.

In another aspect of the present invention, during the process for encapsulating a photovoltaic cell, the electric conductor is composed of two parts: one part is the light-reflecting prism-structured conductive band having a triangle-shaped cross section, and the other part is the flattened conductive band. The light-reflecting prism-structured conductive band is soldered to the fingers of the cell piece, or bonded to the fingers of the cell piece through conductive adhesive. The flattened conductive band is electrically connected to the rear-side electrode of another cell piece through soldering or conductive adhesive.

In another aspect of the present invention, when laminating a module, a groove-shaped strip having an inverted triangle-shaped cross section is firstly prepared on the glass. Each of the two base angles of the inverted triangle is not less than 45 degrees, and the inner wall of each base angle is transparent. The groove-shaped strip having an inverted triangle-shaped cross section is disposed to correspond to the interconnect electrode on the cell piece. When laminating the module, the laminating process must be performed after the groove-shaped strip having an inverted triangle-shaped cross section is aligned to the interconnect electrode.

In another aspect of the present invention, during the process for encapsulating a photovoltaic cell, the conductive adhesive comprises the following raw materials calculated by mass percent: conductive phase at 30-80%, metal and non-metal oxide at 1-10%, organic medium at 5-30%, and organic binding agent and additives at 10-30%.

In another aspect of the present invention, during the process for encapsulating a photovoltaic cell, the fingers are arranged in a discontinuous short-line array. The dimension of the line array is designed to be 5×50-50×150, wherein the width of the line is 0.03 mm-0.2 mm, and the height of the line is 0.005 mm-0.02 mm.

According to the method for encapsulating a photovoltaic cell of the present invention, the cell pieces capable of reducing the blocking light loss can be assembled into a photovoltaic cell. After being assembled, the light-utilizing rate of the photovoltaic cell can be greatly improved, making a significant contribution to the performance enhancement of the photovoltaic cells.

BRIEF DESCRIPTION OF THE DRAWINGS

To clearly expound the present invention or technical solution, the drawings and embodiments are hereinafter combined to illustrate the present invention. Obviously, the drawings are merely some embodiments of the present invention and those skilled in the art can associate themselves with other drawings without paying creative labor.

DETAILED DESCRIPTION OF THE INVENTION

Drawings and detailed embodiments are combined hereinafter to elaborate the technical principles of the present invention.

Embodiment 1

Figure 1:
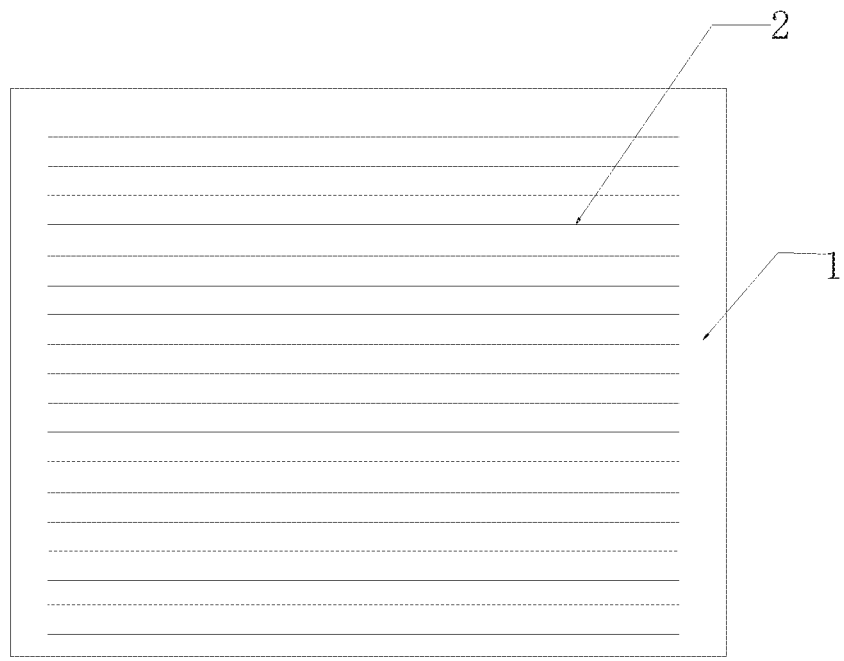
FIG. 1 is a schematic diagram illustrating the arrangement of the fingers of the cell piece of the present invention.

Step 1: preparing a cell piece;

Selecting a polycrystalline silicon cell silicon chip having a dimension of 156 mm×156 mm; subsequently, preparing a crystalline silicon cell after cleaning, texturing, diffusing, removing fouling, preparing an anti-reflection layer, printing rear-side electrode and printing back surface field; finally, preparing the contact electrode structure shown in FIG. 1 through screen-printing. As shown in FIG. 1, a plurality of fingers 2 is distributed in parallel on the cell piece 1.

Specifically, a front-side printing screen having a same structure is firstly prepared, and the conductive contact slurry is deposited on the surface of the cell piece via screen-printing method. After being sintered at a temperature of 200° C.-950° C. in a conventional chain-type sintering furnace, the contact slurry is burnt through the anti-reflection layer on the surface of the silicon chip, and forms an excellent ohmic contact with the emitter of the cell piece in a lower layer, thereby implementing the preparation of a cell piece 1 having complete electrical performances. After being tested by related instruments, cell pieces having same conversion efficiency are sorted out, which can be used in the subsequent laying and series-connecting process of the modules.

Figure 2:
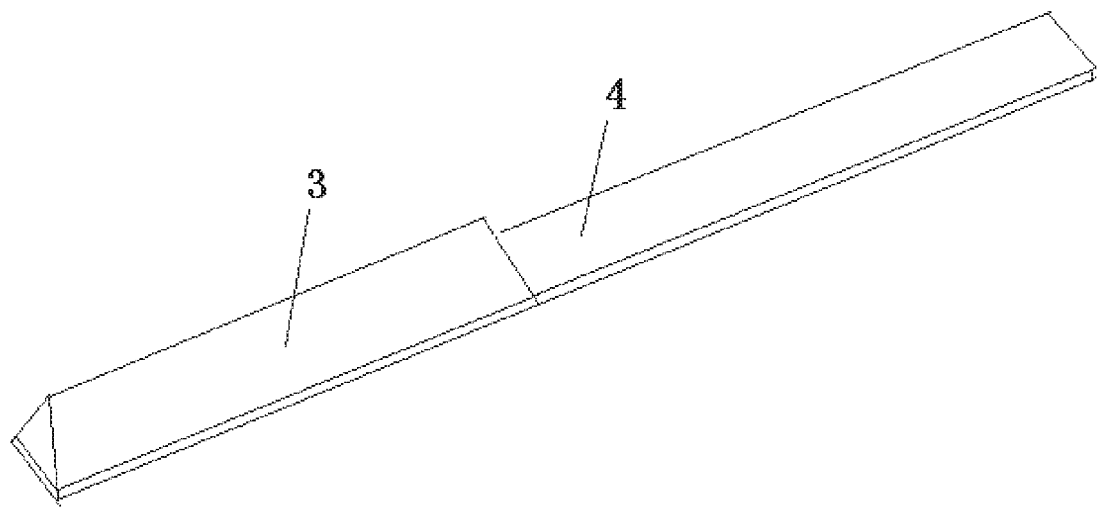
FIG. 2 is a structure diagram of the electric conductor of the present invention.
Figure 3:
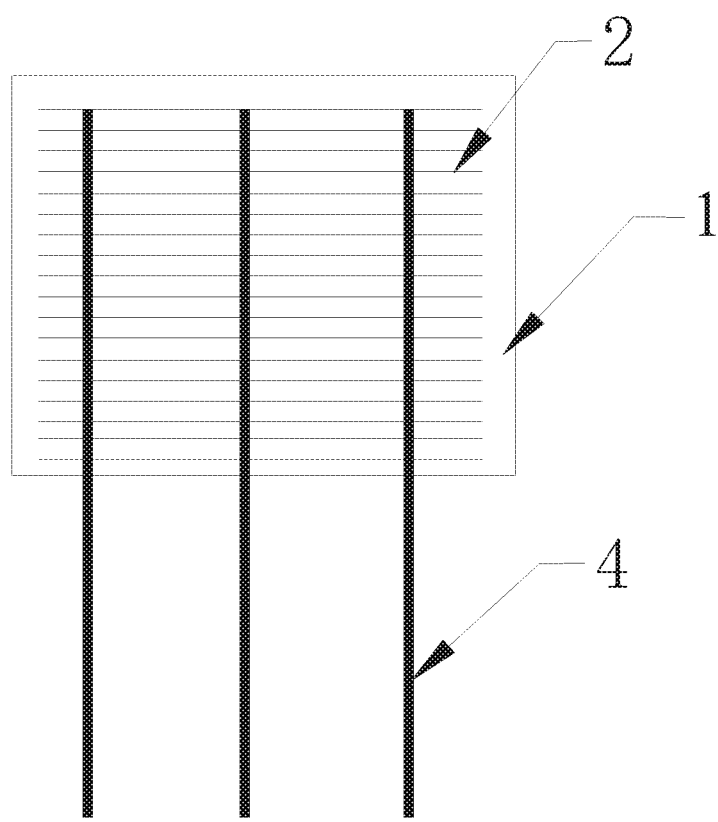
FIG. 3 is a structure diagram of the cell piece provided with a conductive band.

Step 2:

Selecting a conductive band 4 having a dimension of 1 mm×0.2 mm×10 mm as shown in FIG. 2, wherein the conductive band 4 is a tinned copper soldering strip; subsequently, coating one surface of the conductive band 4 with a layer of binding agent having a length of 156 mm; bonding the light-reflecting prism structure 3 having a triangle-shaped cross section to the conductive band 4, thereby forming a combined structure shown in FIG. 2 after being heated and solidified at a temperature of 50° C.-150° C.; as shown in FIG. 1, fingers 2 are printed on the front-side electrode of the cell piece 1 prepared in step 1; subsequently, coating conductive adhesive on the fingers 2; bonding the conductive band 4 of the light-reflecting prism structure 3 having a triangle-shaped cross section in step 2 to the fingers 2, or enabling the conductive band 4 to be perpendicular to the fingers 2, thereby preparing a soldering pad used for soldering and connecting the conductive band 4; subsequently, soldering the conductive band 4 to the soldering pad; after being heated and solidified, the conductive band 4 and the soldering pad are firmly combined, thereby forming a combined structure shown in FIG. 3.

Figure 5:
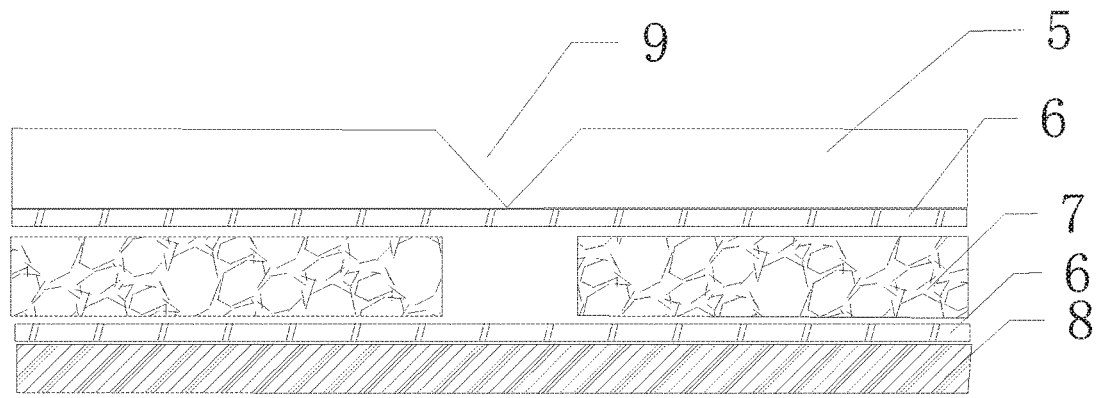
FIG. 5 is a sectional view of the photovoltaic cell.

Step 3: laying the laminating materials of the lower layers of the module;

As shown in FIG. 5, laying back-panel 8 and EVA 6 on the baseplate glass; the baseplate glass can effectively improve the intensity of the base.

Figure 4:
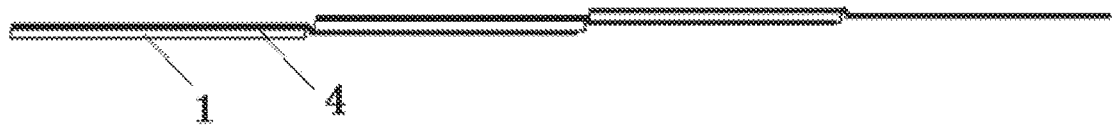
FIG. 4 is a structure diagram of the assembled cell pieces.

Step 4: laying and connecting the cell pieces;

Bonding the portion of the conductive band 4 that exceeds the length of a cell piece to the rear-side electrode of another cell piece through conductive adhesive; or soldering the conductive band 4 to the rear-side electrode of another cell piece, thereby enabling the positive electrode of one cell piece to be electrically connected to the negative electrode of another; subsequently, as shown in FIG. 4, series-connecting all of the cell units; heating the cell pieces by hot wind or infrared at a temperature of 50° C.-150° C., thereby implementing the process of laying and connecting all of the cell pieces.

Step 5: laying the laminating materials of the upper layers of the module;

Sequentially laying EVA 6 and glass 5 as shown in FIG. 5; placing the light-absorbing strip 9 of the cell piece on the glass 5, wherein the light-absorbing strip 9 of the cell piece is a groove-shaped structure having an inverted triangle-shaped cross section; each of the two base angles of the inverted triangle is not less than 45 degrees, and the inner wall of each base angle is transparent; subsequently, aligning the light-absorbing strip 9 to the space between the cell pieces before performing a laminating process; after completing the above steps, placing the module into the laminating machine for receiving a standard laminating process;

Step 6: mounting the accessories to the module;

Mounting the accessories (e.g., frame, junction box, etc.) to the laminated module, thereby implementing the process of preparing a module;

The following method can also be adopted in step 2 of this embodiment:

Selecting a conductive band 4 having a dimension of 1 mm×0.2 mm×310 mm, wherein the conductive band 4 is a tinned copper soldering strip; perpendicularly bonding the conductive band 4 to the fingers 2 through conductive adhesive, or soldering the conductive band 4 to the fingers 2 in a conventional soldering way, thereby forming a combined structure shown in FIG. 2; subsequently, bonding the light-reflecting prism structure 3 having a triangle-shaped cross section to the conductive band 4 on the cell piece.

Embodiment 2

Step 1: preparing a cell piece;

Selecting a polycrystalline silicon cell silicon chip having a dimension of 156 mm×156 mm; subsequently, preparing a crystalline silicon cell after cleaning, texturing, diffusing, removing fouling, preparing an anti-reflection layer, printing rear-side electrodes and printing back surface field; finally, preparing the contact electrode structure shown in FIG. 1 through screen-printing. As shown in FIG. 1, a plurality of fingers 2 is distributed in parallel on the cell piece 1.

Specifically, a front-side printing screen having a same structure is firstly prepared, and the conductive contact slurry is deposited on the surface of the cell piece via screen-printing method. After being sintered at a temperature of 200° C.-950° C. in a conventional chain-type sintering furnace, the contact slurry is burnt through the anti-reflection layer on the surface of the cell silicon chip, and forms an excellent ohmic contact with the emitter of the cell piece in a lower layer, thereby implementing the preparation of a cell piece 1 having complete electrical performances. After being tested by the testing instrument, cell pieces having same conversion efficiency are sorted out, which can be used in the subsequent laying and series-connecting process of the modules.

Step 2: laying and connecting the cell pieces;

Soldering and series-connecting the prepared cell pieces through the tinned copper soldering strips having a dimension of 1 mm×0.2 mm×310 mm (equaling to the conductive band 4 in embodiment 1) by a traditional soldering and series-connecting technology, or bonding the tinned copper soldering strip having a dimension of 1 mm*0.2 mm*310 mm to the cell piece through conductive adhesive; subsequently, bonding the portion of the conductive band 4 that exceeds the length of a cell piece to the rear-side electrode of another cell piece through conductive adhesive, or soldering the conductive band 4 to the rear-side electrode of another cell piece, thereby enabling the positive electrode of one cell piece to be electrically connected to the negative electrode of another; subsequently, coating the binding agent on the tinned copper soldering strip, and bonding the light-reflecting prism structure 3 having a triangle-shaped cross section to the tinned copper soldering strip, thereby enabling them to be firmly combined.

Step 3:

As shown in FIG. 5, sequentially laying back-panel 8, EVA 6, cell group 7, EVA 6, glass 5 on a glass bedding layer; in this step, the light-absorbing strip must be aligned to the space between the cell pieces (in this embodiment, the light-absorbing strip of the cell piece can be that adopted in embodiment 1, or can be the triangle-shaped prism which is disposed in the space between the cell pieces and has a triangle-shaped cross section; this prism structure is correspondingly bonded to the space between the cell pieces).

Step 4: laminating the module;

After completing the above steps, placing the module into a laminating machine for receiving a standard laminating process;

Step 5: mounting the accessories to the module;

Mounting the accessories (e.g., frame, junction box, etc.) to the laminated module, thereby implementing the process of preparing a module;

The following method for laying and connecting cell pieces can also be adopted in step 2 of this embodiment:

Firstly, bonding the light-reflecting prism structure 3 having a triangle-shaped cross section to the conductive band 4 having a dimension of 1 mm×0.2 mm×310 mm, wherein the conductive band 4 is a tinned copper soldering strip; subsequently, perpendicularly bonding the conductive band 4 to the fingers of the cell piece through conductive adhesive, or directly soldering the conductive band 4 to the cell piece that is perpendicular to the fingers; subsequently, electrically connecting the portion of the conductive band 4 that exceeds the cell piece to the rear-side electrode of another cell piece; finally, repeating the above steps, thereby implementing the connection of all cell pieces.

Embodiment 3

Step 1: preparing a cell piece;

Selecting a polycrystalline silicon cell silicon chip having a dimension of 156 mm×156 mm; subsequently, preparing a crystalline silicon cell after cleaning, texturing, diffusing, removing fouling, preparing an anti-reflection layer, printing rear-side electrodes and printing back surface field; finally, preparing the contact electrode structure shown in FIG. 1 through screen-printing. As shown in FIG. 1, a plurality of fingers 2 is distributed in parallel on the cell piece 1.

Specifically, a front-side printing screen having a same structure is firstly prepared, and the conductive contact slurry is deposited on the surface of the cell piece via screen-printing method. After being sintered at a temperature of 200° C.-950° C. in a conventional chain-type sintering furnace, the contact slurry is burnt through the anti-reflection layer on the surface of the cell silicon chip, and forms an excellent ohmic contact with the emitter of the cell piece in a lower layer, thereby implementing the preparation of a cell piece 1 having complete electrical performances. After being tested by the testing instrument, cell pieces having same conversion efficiency are sorted out, which can be used in the subsequent laying and series-connecting process of the modules.

Step 2: connecting the cell pieces;

Selecting a conductive band 4 having a dimension of 1 mm×0.2 mm×310 mm, wherein the conductive band 4 is a tinned copper soldering strip, and half portion of the conductive band 4 is a light-reflecting prism-structured conductive band having a triangle-shaped cross section; as shown in FIG. 4, perpendicularly bonding the light-reflecting prism-structured conductive band having a triangle-shaped cross section to the fingers through conductive adhesive, or soldering it to the fingers of the cell piece according to a conventional soldering method; subsequently, bonding the flattened conductive band to the rear-side electrode of another cell piece through conductive adhesive, or soldering the flattened conductive band to the rear-side electrode of the cell piece via a conventional soldering method, thereby enabling the two cell pieces to be electrically connected; finally, heating and solidifying the conductive band and the cell piece, enabling them to be firmly combined. Thus, the structure shown in FIG. 3 is formed.

Step 3: laying the laminating materials of the module;

As shown in FIG. 5, sequentially laying back-panel 8, EVA 6, cell piece 7, EVA 6 and glass 5 from bottom to top on a baseplate glass; the baseplate glass can improve the intensity of the base; a light-absorbing strip of the cell piece is disposed on the glass 5, and the light-absorbing strip of the cell piece is a groove-shaped structure having an inverted triangle-shaped cross section; each of the two base angles of the inverted triangle is not less than 45 degrees, and the inner wall of each base angle is transparent; during the laminating process, the light-absorbing strip of the cell piece must be aligned to the space between the cell pieces; after laying all of the materials, placing the module into a laminating machine for receiving a standard laminating process.

Step 4: mounting accessories to the module;

Mounting the accessories (e.g., frame, junction box, etc.) to the laminated module, thereby implementing the process of preparing a module;

In step 3 of this embodiment, the light-absorbing strip of the cell piece can also be a light-reflecting triangular prism disposed between the cell pieces, namely, the prism structure having a triangle-shaped cross section.

Embodiment 4

Step 1: preparing a cell piece;

Selecting a polycrystalline silicon cell silicon chip having a dimension of 156 mm×156 mm; subsequently, preparing a crystalline silicon cell after cleaning, texturing, diffusing, removing fouling, preparing an anti-reflection layer, printing rear-side electrodes and printing back surface field; finally, preparing the contact electrode structure shown in FIG. 1 through screen-printing. As shown in FIG. 1, a plurality of fingers 2 is distributed in parallel on the cell piece 1.

Specifically, a front-side printing screen having a same structure is firstly prepared, and the conductive contact slurry is deposited on the surface of the cell piece via screen-printing method. After being sintered at a temperature of 200° C.-950° C. in a conventional chain-type sintering furnace, the contact slurry is burnt through the anti-reflection layer on the surface of the cell silicon chip, and forms an excellent ohmic contact with the emitter of the cell piece in a lower layer, thereby implementing the preparation of a cell piece 1 having complete electrical performances. After being tested by the testing instrument, cell pieces having same conversion efficiency are sorted out, which can be used in the subsequent laying and series-connecting process of the modules.

Step 2:

As shown in FIG. 2, selecting a conductive band 4 having a dimension of 1 mm×0.2 mm×310 mm, wherein the conductive band 4 is a tinned copper soldering strip; subsequently, perpendicularly bonding or soldering the conductive band 4 to the fingers of the cell piece, thereby forming the combined structure shown in FIG. 3; subsequently, bonding the portion of the conductive band 4 that exceeds the length of a cell piece to the rear-side electrode of the cell piece through conductive adhesive, enabling one cell piece to be electrically connected to another; After electrically connecting a plurality of cell pieces, the cell group shown in FIG. 4 is prepared.

Step 3: laying the laminating materials of the module;

As shown in FIG. 5, sequentially laying back-panel 8, EVA 6, cell piece 7, EVA 6 and glass 5 from bottom to top on a baseplate glass, wherein the baseplate glass can improve the intensity of the base; after laying and aligning all of the materials, placing the module into a laminating machine for receiving a standard laminating process.

Step 4: mounting accessories to the module;

Mounting the accessories (e.g., frame, junction box, etc.) to the laminated module, thereby implementing the process of preparing a module;

In this embodiment, the conductive band 4 is not specially processed to reduce the blocking light loss. Therefore, in order to reduce the light loss, a groove-shaped structure having an inverted triangle-shaped cross section is disposed on the glass 5. Each of the two base angles of the inverted triangle is not less than 45 degrees, and the inner wall of each base angle is transparent. The triangular groove-shaped structure is disposed to correspond to the conductive band 4 on the cell pieces. Furthermore, the inverted triangular grooved-shaped structure is disposed on the glass 5 and is disposed in the space between the cell pieces.

Embodiment 5

The difference between this embodiment and embodiment 4 is: the space between the cell pieces is provided with a prism structure having a triangle-shaped cross section; the prism structure is correspondingly bonded to the space between the cell pieces; before laminating the module, the glass must be aligned to the corresponding position of the cell piece.

Embodiment 6

Figure 6:
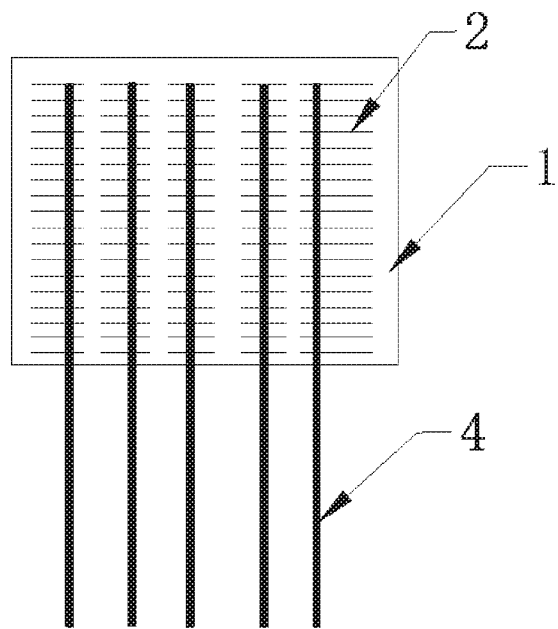
FIG. 6 is a schematic diagram illustrating the arrangement of the fingers of another cell piece provided with a conductive band.
Figure 7:
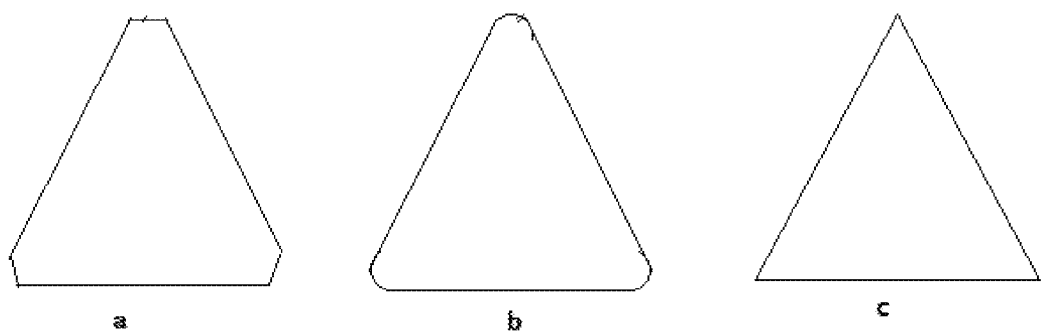
FIG. 7 is a structure diagram of the triangular prism light-reflecting strip having various-shaped vertex angles.

The difference between this embodiment and other embodiments is:

As shown in FIG. 6, the fingers of the cell piece are arranged in a discontinuous short-line array; the dimension of the line array is designed to be 5×50-50×150, wherein the width of the line is 0.03 mm-0.2 mm, and the height of the line is 0.005 mm-0.02 mm.

In the above embodiment, the conductive adhesive comprises the following raw materials calculated by mass percent: conductive phase at 30-80%, metal and non-metal oxide at 1-10%, organic medium at 5-30%, and organic binding agent and additives at 10-30%.

The conductive phase is a mixture composed of one or more materials selected from silver powder, copper powder, silver-plated copper powder, gold powder, palladium powder, nickel powder and other metal powders having an excellent conductivity or advantageous characteristic. In the mixture of metal and non-metal oxide, the metal material is composed of at least three materials selected from lead, bismuth, calcium, magnesium, zinc, platinum, tantalum, rhodium, nickel, chromium and palladium. The non-metal oxide is a mixture composed of at least two oxides selected from diboron trioxide, phosphorus pentoxide, vanadium pentoxide and tellurium trioxide. The organic binding agent is a material selected from ethyl cellulose, acrylic resin, cellulose nitrate and phenolic resin, or can be a mixture of them. The organic medium is selected from terpilenol, carbitol, diethylene glycol monoethyl, or can be a mixture of them. The additives comprises surface active agent, thixotropic agent, defoaming agent, dispersing agent, sintering inhibitor, oxidation inhibitor and swelling inhibitor. After being sufficiently mixed and uniformly stirred, the above materials can be made into the conductive adhesive of the present invention through special equipment. The conductive adhesive prepared according to above mixing ratio has a high bonding force at the temperature of 100-500° C., which can effectively bond the interconnect electrode to the surface of the cell piece while maintaining a good electrical conductivity.

The description of above embodiments allows those skilled in the art to realize or use the present invention. Without departing from the spirit and essence of the present invention, those skilled in the art can combine, change or modify correspondingly according to the present invention. Therefore, the protective range of the present invention should not be limited to the embodiments above but conform to the widest protective range which is consistent with the principles and innovative characteristics of the present invention. Although some special terms are used in the description of the present invention, the scope of the invention should not necessarily be limited by this description. The scope of the present invention is defined by the claims.

What is claimed is:

1. A process for encapsulating a photovoltaic cell, comprising:
    electrically connecting a plurality of cell pieces to form a cell group, wherein:
        a first cell piece of the plurality of cell pieces is electrically connected with a second cell piece of the plurality of cell pieces through at least one electric conductor,
        one end of the at least one electric conductor is bonded with a front-side electrode of the first cell piece, and another end of the at least one electric conductor is bonded with a rear-side electrode of the second cell piece,
        a length of the at least one electric conductor is approximately two times of that of the first cell piece, and the at least one electric conductor extends and is bonded to the rear-side electrode of the second cell piece, and
        the front-side electrode of the first cell piece includes a positive electrode, and the rear-side electrode of the second cell piece includes a negative electrode;
    disposing and aligning layers of a back panel, a first Ethylene-Vinyl Acetate copolymer (EVA), the cell group, a second EVA, and a glass, wherein: a light-absorbing strip is disposed and aligned between two cell pieces of the cell group, the light-absorbing strip being configured to refract or reflect light irradiating on a space between the two cell pieces; and
    laminating the layers and the light-absorbing strip to form a laminated module of the photovoltaic cell.

2. The process for encapsulating the photovoltaic cell of claim 1, further comprising:
    preparing a groove-shaped structure corresponding to the light-absorbing strip on the glass, wherein
        the light-absorbing strip includes an inverted triangle-shaped cross section,
        each of two base angles of the inverted triangle is equal to or greater than 45 degrees, and a material of the light-absorbing strip is transparent, and
        the light-absorbing strip is disposed into the groove-shaped structure of the glass arranged in a position corresponding to the space between the cell pieces.

3. The process for encapsulating the photovoltaic cell of claim 1, wherein:
    the at least one electric conductor comprises a conductive band and a light-reflecting prism structure having a triangle-shaped cross section,
    each of two base angles of the triangle is equal to or greater than 45 degrees, and surfaces of the light-reflecting prism structure are mirror-surface processed,
    a bottom surface of the light-reflecting prism structure is bonded to the conductive band, and a length of the bottom surface is approximately equal to a width of the conductive band, and
    electrically connecting the plurality of cell pieces to form the cell group, further comprises one of:
        bonding the light-reflecting prism structure to the conductive band; perpendicularly bonding or soldering the conductive band that is bonded to the light-reflecting prism structure to the front-side electrode of the first cell piece through conductive adhesive; and electrically connecting an extending portion of the conductive band that exceeds the length of the first cell piece to the rear-side electrode of the second cell piece through soldering or conductive adhesive; and
        perpendicularly bonding the conductive band to the front-side electrode of the first cell piece through conductive adhesive; electrically connecting the extending portion of the conductive band to the rear-side electrode of the second cell piece through soldering or conductive adhesive; and bonding the light-reflecting prism structure to the conductive band of the first cell piece.

4. The process for encapsulating the photovoltaic cell of claim 1, wherein:
    the at least one electric conductor comprises a light-reflecting prism-structured conductive band and a flattened conductive band,
    the light-reflecting prism-structured conductive band includes a triangle-shaped cross section, and is soldered to the front-side electrode of the first cell piece, or bonded to the front-side electrode of the first cell piece through conductive adhesive, and
    the flattened conductive band electrically connected to the rear-side electrode of the second cell piece through soldering or conductive adhesive.

5. The process for encapsulating the photovoltaic cell of claim 1, further comprising:
    preparing a groove-shaped structure on the glass, wherein:
        the groove-shaped structure includes an inverted triangle-shaped cross section,
        each of two base angles of the inverted triangle is equal to or greater than 45 degrees, and inner walls of the groove-shaped structure are transparent,
        the groove-shaped structure is disposed at a position corresponding to an interconnect electrode of the first and second cell pieces, and
        the interconnect electrode includes a portion of the at least one electric conductor between the first and second cell pieces.

6. The process for encapsulating the photovoltaic cell of claim 3, wherein the conductive adhesive comprises, by mass percentage: conductive phase at 30-80%, metal and non-metal oxide at 1-10%, organic medium at 5-30%, and organic binding agent and additives at 10-30%.

7. The process for encapsulating the photovoltaic cell of claim 1, wherein:

the front-side electrode is arranged in a discontinuous short-line array, and a dimension of the short-line array is designed to be 5×50-50×150, a width of a line of the short-line array being 0.03 mm-0.2 mm, and a height of the line being 0.005 mm-0.02 mm.

8. The process for encapsulating the photovoltaic cell of claim 2, wherein three corners of the triangle of the light-absorbing strip each include vertex.

9. The process for encapsulating the photovoltaic cell of claim 2, wherein three corners of the triangle of the light-absorbing snip each includes an arc-shaped or a platform-like structure from a micro perspective.

10. The process for encapsulating the photovoltaic cell of claim 1, wherein the front-side electrode of the first cell piece is approximately perpendicular to the at least one electric conductor.

11. The process for encapsulating the photovoltaic cell of claim 1, wherein:

the at least one electric conductor comprises a conductive band and a light-reflecting prism structure, and electrically connecting the plurality of cell pieces to form the cell group further comprises one of:

bonding the light-reflecting prism structure to the conductive band; perpendicularly bonding or soldering the conductive band that is bonded to the light-reflecting prism structure to the front-side electrode of the first cell piece through conductive adhesive; and electrically connecting an extending portion of the conductive band that exceeds the length of the first cell piece to the rear-side electrode of the second cell piece through soldering or conductive adhesive; and perpendicularly bonding the conductive band to the front-side electrode of the first cell piece through conductive adhesive; electrically connecting the extending portion of the conductive band to the rear-side electrode of the second cell piece through soldering or conductive adhesive; and bonding the light-reflecting prism structure to the conductive band of the first cell piece.

12. The process for encapsulating the photovoltaic cell of claim 1, wherein:

the at least one electric conductor comprises a conductive band and a light-reflecting prism structure with a triangle-shaped cross section, each of two base angles of the triangle is equal to or greater than 45 degrees; and surfaces of the light-reflecting prism structure are mirror-surface processed, and a bottom surface of the light-reflecting prism structure is bonded to the conductive band, and a length of the bottom surface is approximately equal to a width of the conductive band.

* * * * *